United States Patent [19]

Oda et al.

[11] Patent Number: 5,131,974
[45] Date of Patent: Jul. 21, 1992

[54] METHOD OF CONTROLLING OXYGEN CONCENTRATION IN SINGLE CRYSTAL AND AN APPARATUS THEREFOR

[75] Inventors: Tetsuhiro Oda; Susumu Sonokawa, both of Takefu; Atsushi Ozaki; Toshio Hisaichi, both of Annaka, all of Japan

[73] Assignee: Shin-Etsu Handotai Co., Ltd., Tokyo, Japan

[21] Appl. No.: 614,760

[22] Filed: Nov. 16, 1990

[30] Foreign Application Priority Data

Nov. 16, 1989 [JP] Japan .................. 1-296150

[51] Int. Cl.$^5$ .............................................. C30B 15/20
[52] U.S. Cl. ......................... 156/601; 156/617.1; 156/618.1; 156/620.4; 422/249
[58] Field of Search ............ 156/601, 605, 606, 617.1, 156/618.1, 620.4; 422/249

[56] References Cited

U.S. PATENT DOCUMENTS

| | | | |
|---|---|---|---|
| 3,342,560 | 9/1967 | Eckhardt et al. | 156/601 |
| 3,556,732 | 1/1971 | Chang et al. | 422/249 |
| 4,400,232 | 8/1983 | Ownby et al. | 156/601 |
| 4,956,153 | 9/1990 | Yamagishi et al. | 156/617.1 |

FOREIGN PATENT DOCUMENTS

| | | | |
|---|---|---|---|
| 373899 | 6/1990 | European Pat. Off. | 422/249 |
| 59-30792 | 2/1984 | Japan | 422/249 |
| 61-227986 | 10/1986 | Japan | 156/620.4 |
| 63-270390 | 11/1988 | Japan | 156/601 |

*Primary Examiner*—Robert Kunemund
*Attorney, Agent, or Firm*—Whitham & Marhoefer

[57] ABSTRACT

A method for controlling an oxygen concentration of a single crystal which is pulled up in a Czochralski-method type single crystal pulling apparatus having a hermetical chamber in which the single crystal is pulled up and an inert gas supply and exhaust system by means of which an inert gas is supplied to the hermetical chamber and exhausted therefrom; the method being characterized in that the pneumatic pressure in the hermetical chamber and the supply rate of the inert gas are controlled in accordance with a prepared control pattern with respect to the proportion of the length of the as-grown crystal to the aimed final length thereof or with respect to the passage of time.

3 Claims, 2 Drawing Sheets

METHOD OF CONTROLLING OXYGEN CONCENTRATION IN SINGLE CRYSTAL AND AN APPARATUS THEREFOR

This invention relates to a method and an apparatus for controlling an oxygen concentration in a single crystal ingot (rod) pulled up from a polycrystal melt of a semiconductor substance in Czochralski (CZ) method.

BACKGROUND OF THE INVENTION

With reference to attached FIG. 1, in a CZ method-type single crystal pulling apparatus for growing and raising a single crystal silicon ingot (9) from a polycrystal silicon melt (10), a silicon seed crystal (12) fixed at the lower end of a pull wire (11) (or, alternatively, supported by a pull shaft) is dipped slightly in the silicon melt contained in a synthetic quartz crucible (4) provided in a chamber (2), and is pulled up at a predetermined rate while being turned about its axis by means of the pull wire, whereby a silicon single crystal rod is grown and raised.

In this kind of single crystal pulling apparatus, a chemical reaction takes place between the quartz crucible and the Si melt to generate SiO, which is dissolved in the Si melt. A part of the SiO evaporates from the melt and mixes in the atmosphere within the chamber, and other part stays in the Si melt.

When the SiO in the atmosphere builds up in the chamber, the normal growth of the single crystal is seriously affected. In order to prevent this phenomenon, the chamber is kept under reduced pressure by means of a vacuum pump (18) and, at the same time, it is supplied with an inert gas such as argon gas in order to maintain the inertness of the intrachamber atmosphere. Normally, therefore, the chamber is filled with an inert gas and the pressure in the chamber is kept at the level of ten-odd Torr.

As the pulling of the single crystal proceeds, the amount of SiO gas generated in the chamber increases to thereby push up the intrachamber pressure, which in turn causes stagnation of the flow of the inert gas. In order to prevent this phenomenon, a vacuum gage is attached to the chamber to detect the intrachamber pressure; and based on the result of the pressure measurement, the opening degree of a flow control valve which is provided in the exhaust system is controlled in a manner such that the intrachamber pressure is always constant or changed arbitrarily [Japanese Kokai No. 61-117191 (1986)].

Now, turning our attention to the oxygen concentration of a single crystal, it is known that as the pulling of the single crystal proceeds and the level of the Si melt lowers, the amount of SiO in the Si melt, which virtually determines the oxygen amount in the melt, decreases, and this results in a gradual decrease in the oxygen concentration in the growing single crystal ingot. Consequently, the axial uniformity in the oxygen concentration is lost, and the tail end portion of the ingot may end up with an oxygen concentration less than the minimum allowable value.

In the conventional technology, only the flow of the inert gas was controlled, and as such it was not possible to solve this problem of uneven oxygen concentration. But if the oxygen concentration of the single crystal is to be controlled with a sufficiently high precision, an extremely complicated control of the intrachamber pressure must be conducted with respect to the progress of the single crystal pulling operation.

SUMMARY OF THE INVENTION

This invention was made in view of this problem, and it is, therefore, an object of the invention to provide a method, as well as an apparatus, for controlling the oxygen concentration in a single crystal ingot (rod) pulled up from a polycrystal melt of a semiconductor substance in Czochralski (CZ) method with high precision.

More particularly, an object of the invention is to provide a method and an apparatus which enable arbitrary controlling of axial distribution of oxygen concentration in the single crystal ingot and thus enable growing of a single crystal ingot in which the oxygen concentration is within an allowable range throughout the whole length of the ingot.

According to the invention, a method is proposed for controlling an oxygen concentration of a single crystal which is pulled up in a Czochralski-method type single crystal pulling apparatus having a hermetical chamber in which the single crystal is pulled up and an inert gas supply and exhaust system by means of which an inert gas is supplied to the hermetical chamber and exhausted therefrom; the method being characterized in that the pneumatic pressure in the hermetical chamber and the supply rate of the inert gas are controlled in accordance with a prepared control pattern with respect to the proportion of the length of the growing crystal to the aimed final length thereof or with respect to the time of growing.

Preferably, the prepared control pattern is programmed in a storage of a CPU, and the control operation is conducted in accordance with the command signals from the CPU.

In a preferred embodiment of the method, the prepared control pattern is programmed such that the pneumatic pressure in the hermetical chamber is varied while the supply rate of the inert gas is kept unchanged.

Or alternatively, the prepared control pattern is programmed such that the supply rate of the inert gas is varied while the pneumatic pressure in the hermetical chamber is kept unchanged.

According to the invention, an apparatus is also provided for controlling the oxygen concentration of a single crystal which apparatus comprises a control valve means provided across an exhaust line of the inert gas supply and exhaust system for controlling the pressure in the hermetical chamber, a pressure sensor for detecting the pressure in the hermetical chamber, and a control means for controlling the supply rate of the inert gas to the hermetical chamber.

OPERATION

According to the invention, it is now possible to regulate the growth of a single crystal rod in a manner such that the oxygen concentration of the single crystal rod throughout its entire length becomes within a desired range. For example, in the case of growing a Si single crystal rod; as the proportion of the grown length of the crystal to the aimed final length thereof increases, the pressure in the chamber is increased under control and/or the flow rate of the inert gas supplied to the chamber is decreased under control, such that the evaporation rate of SiO in the chamber is decreased whereby the concentration of SiO remaining in the Si melt in the crucible is increased, with a result that the lengthwise decrease in the oxygen concentration of the single crystal is checked.

BRIEF DESCRIPTION OF THE DRAWINGS

These and other effects of the invention will be realized by reference to the description, taken in connection with the accompanying drawings, in which.

EMBODIMENT

Figure 1:
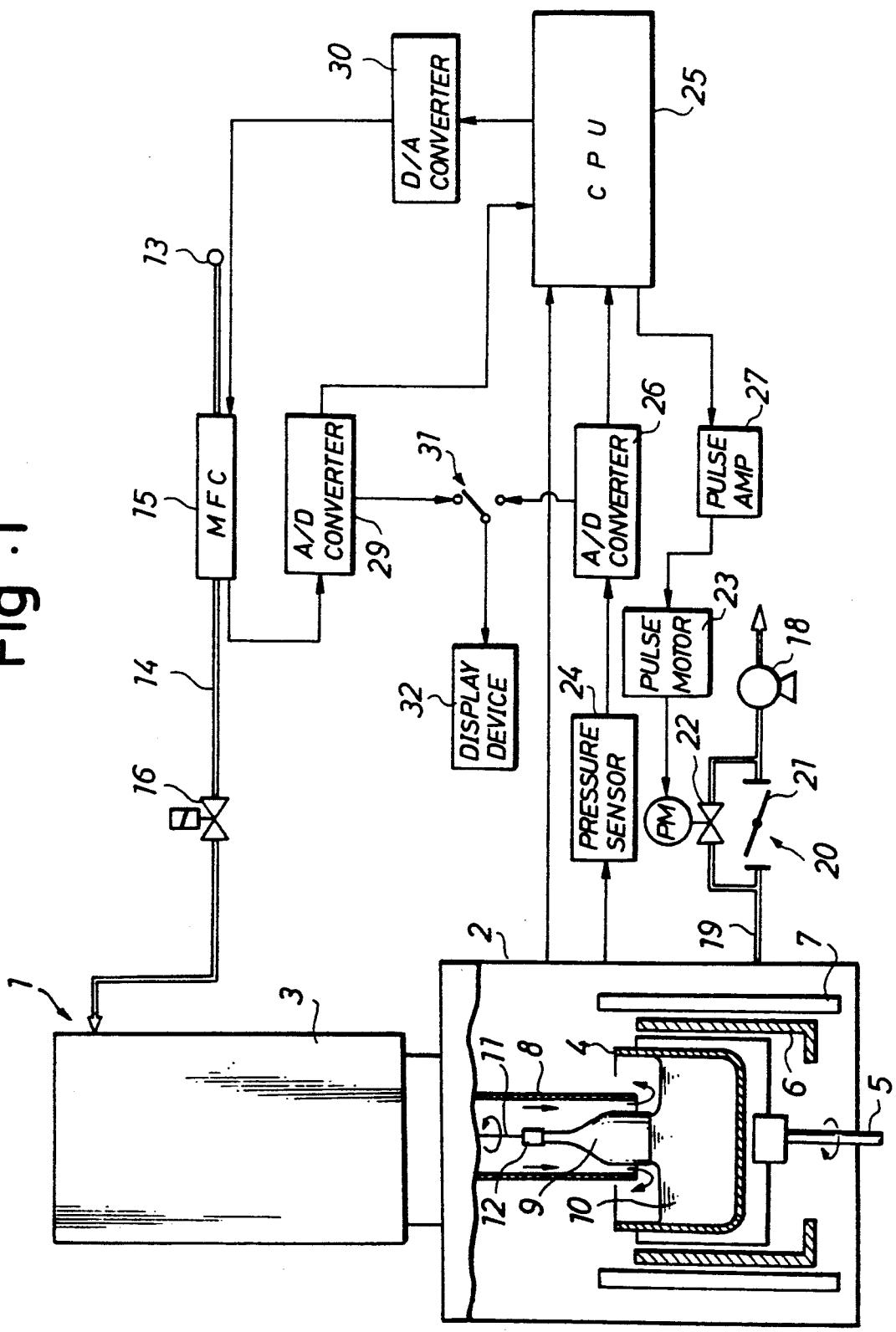
FIG. 1 is a block diagram showing the construction of an oxygen concentration control apparatus of the invention.

An embodiment of the invention will now be described with reference to the attached drawings.

Reference numeral 1 designates a single crystal pulling apparatus based on CZ method, in which a pull chamber 3 is provided above and in coaxial alignment with the chamber 2, both made of a stainless steel. A quartz crucible 4 for containing a semiconductor substance 10 is supported by a support shaft 5 in the chamber 2. The support shaft 5 is adapted to rotate about its axis and shift in the axial direction. If the quartz crucible 4 were always held at the original level, the melt level in the quartz crucible 4 would gradually shift downwards relative to a heater 6 with the growth of a single crystal 9, thus resulting in an instability of the thermal field around the crystal and the melt 10. Therefore, the support shaft 5 is adapted to axially displace the crucible such that the displacement of the melt level (solid-liquid interface) downwards is compensated for by continuous rise of the crucible 4 so that the interface level is stationary relative to the heater 6 during the growing.

Around the heater 6 is provided a cylindrical thermal insulator 7, both made of carbon.

In the upper part of the chamber 2 a purge tube 8 for supplying Ar gas is provided vertically and in coaxial alignment with the growing single crystal 9, which is raised into the purge tube 8. During the single crystal pulling operation, the altitudinal position of the crucible is controlled such that the lower end of the purge tube 8 is always in the upward vicinity of the surface of the melt of the polycrystal Si melt 10.

A seed crystal 12 is fixed at the lower end of a pull wire 11, which hangs within the purge tube 8. The wire 11 is rotated and vertically moved at a rate by means of a drive mechanism, not shown for the sake of simplicity.

Argon gas is supplied to the pull chamber 3 and the chamber 2 from an argon gas supply source 13, e.g. a gas cylinder, by way of a supply line 14, across which are provided a mass flow controller (MFC) 15 and a valve 16. The MFC 15 is capable of controlling the Ar gas flow rate to a set value.

The thus supplied Ar gas and the SiO gas evaporating from the melt are drawn from the chamber 2 by means of a vacuum pump 18. In an exhaust line 19 connecting the chamber 2 with the vacuum pump 18 is provided a conductance valve 20, which consists of an electrically operated butterfly valve 21 and an electrically operated needle valve 22, the valves 21 and 22 being arranged in parallel. The needle valve 22 is driven by a pulse motor 23 such that its opening is precisely controlled.

Incidentally, it is possible to replace the conductance valve 20 with a single electrically controlled butterfly valve or an electrically controlled ball valve.

A pressure sensor 24 is affixed to the chamber 2 for detecting the internal pressure (negative pressure) of the chamber 2.

In FIG. 1, reference numeral 25 designates a central processing unit (CPU) 25 which constitutes control means adapted to control the internal pressure of the chamber 2 and/or the Ar gas flow rate by controlling the opening of the needle valve 22 chiefly in response to the pressure value detected by the pressure sensor 24 in accordance with a control pattern corresponding to the length of the growing single crystal ingot.

In particular, the pressure value (analog value) detected by the pressure sensor 24 is digitized through an A/D converter 26, and inputted to the CPU 25, which 25 outputs a control signal responsive to the detected pressure value. This control signal is amplified through a pulse amplifier 27, and inputted to the pulse motor 23, which, thereupon, drives the needle valve 22 to control the opening thereof based on the control signal received. As a result, the internal pressure of the chamber 2 and/or the Ar gas flow rate is controlled in accordance with the control pattern. When the opening of the needle valve 22 is decreased, the intrachamber pressure increases, and the flow rate of the Ar gas is lowered.

When it is not possible to control the pressure of the chamber 2 by only adjusting the opening degree of the needle valve 22, the opening of the MFC 15 is adjusted to change the Ar flow rate to thereby control the pressure in the chamber 2.

The flow rate of Ar gas (analog value) detected by the mass flow controller 15 is digitized through the A/D converter 29, and supplied to the CPU 25 as a feedback. The CPU 25 compares this detected Ar gas flow rate with a reference value for Ar gas flow rate, and generates a control signal (digital signal) based on the result of the comparison. Then, this digital control signal is converted into an analog signal through a D/A converter 30 and inputted to the MFC 15 to renew the set value to which the Ar gas flow rate is controlled.

The Ar gas flow rate detected by the MFC 15 and the internal pressure of the chamber 2 detected by the pressure sensor 24 are alternatively displayed on the display device 32 by alternating the switch 31.

To pull up the Si single crystal 9 based on the CZ method in the single crystal pulling apparatus 1, lumps of polycrystal silicon having appropriate sizes are charged into the crucible 4, and melted by the heater 6; then the seed crystal 12 connected to the lower end of the wire 11 is lowered until it comes in contact with the Si melt 10 contained in the crucible 4. After the lower end of the seed crystal 12 is partially melted, the melt temperature is lowered to such an extent that the seed crystal would not be melted any more. Then, the wire carrying the seed crystal is pulled up at a rate, and a single crystal grows on the seed crystal, while the crystal and the melt are counter-rotated with respect to each other. During this operation, Ar gas is supplied to the chamber 2 through the purge tube 8, and this Ar gas and the SiO gas evaporating from the melt are drawn out of the chamber 2 by the vacuum pump 18.

As the single crystal pulling operation proceeds, the melt level shifts downwards relative to the crucible, and, as a result, the ratio of the surface area to volume of Si melt increases gradually whereby the concentration of SiO, or oxygen concentration, in the Si melt 10 decreases, which results in progressively decreasing oxygen concentration in the single crystal 9.

With the view of preventing this phenomenon of gradual decrease in the oxygen concentration of the single crystal ingot with time, experiments were conducted and the result in one of them is as follows: the opening of the needle valve 22 was controlled in a manner such that the pressure in the chamber 2 was maintained constant (100 millibar), and the flow rate of the Ar gas was gradually decreased along a curve shown in FIG. 2 by means of the MFC 15 as the single crystal ingot grows longer; the analysis of the oxygen concentration of the resulting silicon single crystal ingot (FIG. 3) revealed that the oxygen concentration did not decrease with time, but increased at a low rate as the crystallization proceeded. Incidentally, the axis of abscissa represents the percentage of the grown length of the ingot based on the final length thereof. It is postulated that the oxygen concentration picked up, rather than kept decreasing, because as the Ar gas flow rate decreased, the evaporation amount of the SiO gas also decreased in the chamber 2 whereby the amount of SiO staying in the Si melt 10 increased and more oxygen could enter the single crystal 9.

Figure 2:
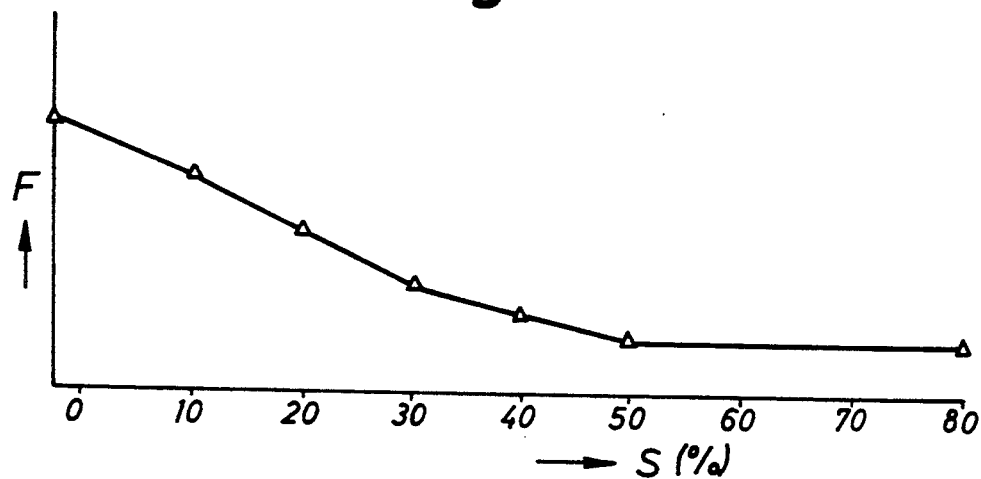
FIG. 2 is a graph showing a variation made of argon gas flow rate with respect to the growing length of the single crystal ingot.
Figure 3:
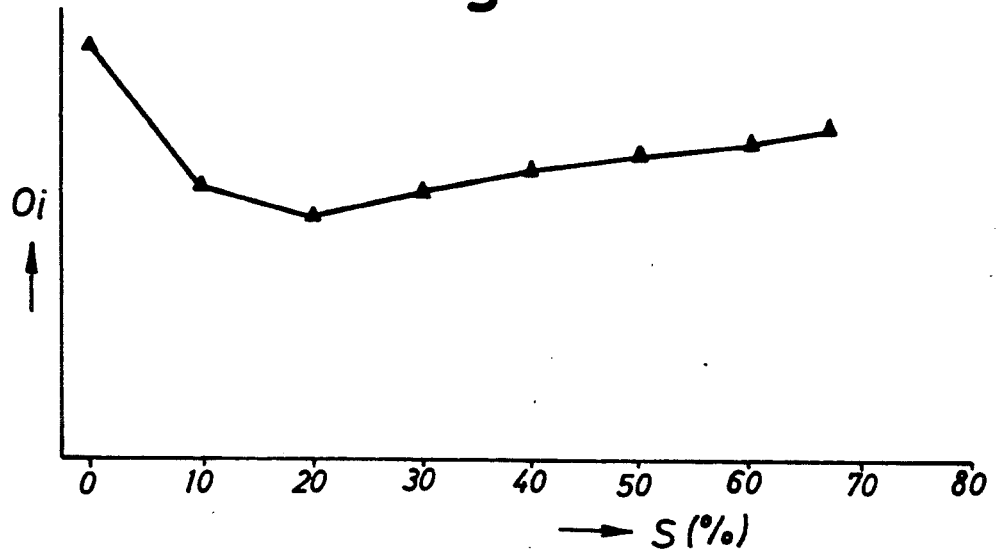
FIG. 3 is a graph showing an oxygen concentration distribution along the length of the as-grown single crystal ingot.

As described above, it is possible to control the Ar gas flow rate in accordance with a control pattern, like that of FIG. 2, stored in the CPU 25, so that it is possible to arbitrarily control the oxygen concentration of the single crystal ingot after conducting trial operations. Consequently, the oxygen concentration throughout the whole length of the single crystal 9 can be controlled to be within a desired range.

Since by increasing the pressure in the chamber 2 the evaporation rate of the SiO decreases, it is also possible to attain a similar result as above by controlling the opening of the needle valve 22, instead of controlling the Ar gas flow rate at the MFC 15, in accordance with a pattern stored in CPU.

Incidentally, the control pattern, according to which the changes in the pressure in the chamber 2 and/or the Ar gas flow rate are ruled, is programmed in advance in a memory of the CPU, and the manner of determining such a pattern is carried out in the following procedure.

Let P represent the pressure in the chamber 2, F the Ar gas flow rate, S the grown length of the single crystal ingot divide by the final length thereof $O_i$ the oxygen concentration, then it is empirically confirmed that $O_i$ at S is given by the following linear Equation (1):

$$O_i = aS + bP + cF + d \tag{1}$$

where a, b, c, and d are empirically obtained coefficients. An example of Equation (1) can be as follows:

$$O_i = -0.1S + 0.03P - 0.01F + 20 \tag{2}$$

Since the coefficients a, b, c, and d are modified depending on different conditions, such as different kinds of pulling apparatus and pulling condition, these coefficients must be determined responsive to various operational and other conditions.

For example, in a trial operation, while the pressure P and the Ar gas flow rate F are kept constant, the oxygen concentration $O_i$ is measured with respect to different percentages S. Then, the measured oxygen concentration $O_i$ is plotted and the coefficient value a is obtained as the general gradient of the curve (i.e., $\partial O_i / \partial S = a$). Similarly, while the Ar gas flow rate F and the percentage S are kept constant, the oxygen concentration $O_i$ is measured with respect to different pressure P. And the value of coefficient b is obtained as the gradient of the curve of $O_i$ vs. P (i.e., $\partial O_i / \partial P = b$). Next, while the pressure P and the percentage S are kept constant, the oxygen concentration $O_i$ is measured with respect to different flow rate F. The value of coefficient c is determined as the gradient of the curve of $O_i$ vs. F (i.e., $\partial O_i / \partial F = c$).

Different tentative values for d are obtained from the equation (1) by substituting in the equation the values of a, b, c, and the actually measured values of S, P, and F. The desired value for the constant d is determined as the arithmetic mean of these tentative d values.

Next, a simplified method will be described for obtaining a control pattern which, when observed, will produce a single crystal ingot in which the oxygen concentration is uniform with respect to the axis of the ingot.

First, a single crystal ingot is grown under a condition where the pressure P of the chamber 2 and the Ar gas flow rate F are kept constant, and the $O_i$ is measured and plotted with respect to S to thereby an $O_i$ profile. Thereafter, S is divided up into small segments having a width of $\Delta S$, and the oxygen concentration $O_i$ corresponding to the S value at each increment end of the segment $\Delta S$ is obtained. If it is intended that the oxygen concentration $O_i 0$ is controlled to and maintained at a desired constant value $O_i 0$ through variation of the pressure P alone while the Ar flow rate is kept unchanged at Fc, the following procedure is taken. Let the initial condition be such that $P = P0$, $O_i = O_i 0$, and $S = S0$. Then, the increment $\Delta P$ from P0 that would cause the oxygen concentration to increase by $O_i$ at Fc which is the difference between $O_i 0$ and the measured value $\Delta O_i 1$ at the increment end of the first segment $\Delta S$, is obtained from Equation (1) or (2) and the $O_i$ profile. Namely, the value $\Delta P$ is obtained in the following procedure:

$$O_i 0 = aS0 + bP0 + cFc + d \tag{3}$$

$$O_i 1 = aS + bP + cFc + d \tag{4}$$

Subtracting Equation (3) from Equation (4) gives:

$$O_i 1 - O_i 0 = a(S - S0) + b(P - P0)$$

or $$O_i 1 - O_i 0 = a\Delta S + b\Delta P$$

and hence:

$$\Delta P = (O_i 1 - O_i 0 - a\Delta S)/b$$

The same operation is repeated with respect to the second segment $\Delta S$, and so on. Each resultant increment $\Delta P$ is added to the preceding $P0 + \Sigma P$ value, and thus the desired control pattern of $\Delta P$ is obtained. Such a control pattern is stored in a memory of the CPU 25, and in accordance with the control pattern, the pressure P of the chamber 2 is controlled to the aimed values which give constant $O_i 0$.

Similarly, the like controlling of the Ar gas flow rate F while the pressure P of the chamber 2 is kept constant can give a uniform $O_i$ throughout the ingot. However, it should be noted that in this case, unlike the case of controlling by the chamber pressure P, the Ar flow rate F ought to be decreased, rather than increased, to obtain constant oxygen concentration. Although in the above embodiment of the invention, the controlling of the oxygen concentration throughout the length of the single crystal ingot is conducted with respect to the ratio of the grown length per the aimed final length, it is possible to conduct the same with respect to the time that passes from the start of the pulling operation.

EFFECTS OF THE INVENTION

As is clear from the above description, the invention provides a method and an apparatus which enable arbitrary controlling of oxygen concentration with respect to the axis of the single crystal ingot raised in a CZ type pulling apparatus.

What is claimed is:

1. A method for controlling an oxygen concentration of a single crystal which is pulled up in a Czochralski-method type single crystal pulling apparatus having a hermetical chamber in which the single crystal is pulled up and an inert gas supply and exhaust system by means of which an inert gas is supplied to said hermetical chamber and exhausted therefrom; said method being characterized in that the pneumatic pressure in said hermetical chamber and the supply rate of said inert gas are controlled in accordance with a prepared control pattern with respect to the proportion of the grown length of the crystal to the aimed final length thereof, wherein said prepared control pattern is programmed in a memory of a central processing unit, and the control operation is conducted in accordance with command signals from said processing unit, said prepared control pattern is programmed based on the following linear equation:

$$O_i = aS + bP + cF + d$$

where $O_i$ is the oxygen concentration, S the proportion of the length of the crystal to the aimed final length thereof, P the pneumatic pressure in said hermetical chamber, F the supply rate of said inert gas, and a, b, c, and d are empirically obtained coefficients.

2. The method as claimed in claim 1, wherein said prepared control pattern is such that the pneumatic pressure in said hermetical chamber is varied while the supply rate of said inert gas is kept unchanged.

3. The method as claimed in claim 1, wherein said prepared control pattern is such that the supply rate of said inert gas is varied while the pneumatic pressure in said hermetical chamber is kept unchanged.

* * * * *